(12) United States Patent
Chung et al.

(10) Patent No.: US 7,002,804 B2
(45) Date of Patent: Feb. 21, 2006

(54) HEAT DISSIPATING APPARATUS

(75) Inventors: Chao-Tsai Chung, Taipei (TW); Wan-Chin Hsiao, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 274 days.

(21) Appl. No.: 10/699,775

(22) Filed: Nov. 4, 2003

(65) Prior Publication Data

US 2004/0240181 A1 Dec. 2, 2004

(30) Foreign Application Priority Data

May 28, 2003 (TW) ................. 92114367 A

(51) Int. Cl.
*H05K 7/20* (2006.01)

(52) U.S. Cl. .................. 361/704; 361/709; 361/710; 165/80.3; 165/185; 257/706; 257/707

(58) Field of Classification Search ........ 361/700–712, 361/717–724; 165/80.3, 80.4, 185; 257/706–718; 174/35 R, 16.3, 51, 260; 439/68, 70, 73, 439/108

See application file for complete search history.

(56) References Cited

U.S. PATENT DOCUMENTS

| 5,241,453 A | * | 8/1993 | Bright et al. | ............... 361/704 |
| 5,651,688 A | * | 7/1997 | Lin | ........................ 439/331 |

FOREIGN PATENT DOCUMENTS

| JP | 402012953 A | * | 1/1990 |
| JP | 405003235 A | * | 1/1993 |
| JP | 534356 |   | 5/2003 |

* cited by examiner

Primary Examiner—Michael Datskovskiy
(74) Attorney, Agent, or Firm—Birch Stewart Kolasch & Birch LLP

(57) ABSTRACT

A heat dissipating apparatus for an electronic device having an integrated heat spreader is disclosed. The integrated heat spreader is disposed on the electronic device. The electronic device is inserted into a socket. The heat dissipating apparatus includes a base and at least one fin. The base is connected to the integrated heat spreader and has a concave area. When the base is connected to the integrated heat spreader, a contact area is thereby formed. The shape and position of the contact area correspond to those of the integrated heat spreader. The concave area is formed on the base and extended from the edge of the base to the contact area. The fin is formed on the base.

15 Claims, 5 Drawing Sheets

HEAT DISSIPATING APPARATUS

This nonprovisional application claims priority under 35 U.S.C. § 119(a) on Patent Application No. 092114367 filed in TAIWAN, R.O.C. on May 28, 2003, the entire contents of which are hereby incorporated by reference.

BACKGROUND OF THE INVENTION

1. Field of the Invention

The present invention relates to a heat dissipating apparatus, and in particular to a heat dissipating apparatus that is easily disassembled from an electronic device.

2. Description of the Related Art

Generally speaking, a central processing unit, such as Intel Pentium 4 Northwood, employed in a desktop or portable computer is combined with an integrated heat spreader (IHS). The integrated heat spreader is composed of copper-based alloy to dissipate heat generated by the central processing unit.

Referring to FIG. 1, a central processing unit (CPU) 1 includes a substrate 11, multiple pins 12 and a silicon chip 13. The silicon chip 13 is disposed on the substrate 11, and the multiple pins 12 are disposed under the substrate 11. Additionally, an integrated heat spreader 2 is disposed on the substrate 11. The integrated heat spreader 2 has a recess (not shown) to receive the silicon chip 13

Referring to FIG. 2, when the CPU 1 having the integrated heat spreader 2 is inserted into a socket 3 of a computer main board by means of the pins 12 thereof, a heat sink 4 is also disposed on the integrated heat spreader 2 to dissipate heat generated by the CPU 1. Nevertheless, since the contact surface between the integrated heat spreader 2 and heat sink 4 may be uneven, a gap (not shown) exists therebetween. Heat conduction between the integrated heat spreader 2 and heat sink 4 is adversely affected by the gap. A thin layer of thermal paste, such as a phase change material (PCM) 5, is disposed between the integrated heat spreader 2 and base 41 of the heat sink 4 to enhance the heat conduction therebetween. The phase change material 5 fills the gap between the integrated heat spreader 2 and base 41 of the heat sink 4 to increase the contact area therebetween, thereby enhancing the heat conduction between the integrated heat spreader 2 and heat sink 4.

The following description explains the characteristic of the phase change material 5. Because the melting point of the phase change material 5 is approximately 50° C., the phase change material 5 is solid at room temperature. The phase change material 5 melts and becomes liquid when the ambient temperature exceeds 50° C., thereby filling the gap between the integrated heat spreader 2 and base 41 of the heat sink 4. When the ambient temperature is below 50° C. again, the phase change material 5 becomes solid. Additionally, the phase change material 5 has low thermal resistance, such that the thermal conduction rate thereof is much higher than that of a conventional silicone rubber.

Accordingly, when the CPU 1 operates at high temperature (greater than 50° C.), the phase change material 5 melts and is attached to the integrated heat spreader 2 and base 41. When the CPU 1 cools, the phase change material 5 solidifies, creating a strong adhesive bond between the integrated heat spreader 2 and the base 41. As a result, when the CPU 1 is replaced, the heat sink 4 and CPU 1 are sequentially disassembled from the socket 3. When the heat sink 4 is removed from the socket 3, the strong adhesive bond between the integrated heat spreader 2 and base 41 (the adhesive force between the integrated heat spreader 2 and base 41 greater than the clamping force between the socket 3 and pins 12 of the CPU 1) cause that the heat sink 4 and CPU 1 are simultaneously separated from the socket 3. At this point, the pins 12 of the CPU 1 are often bent or broken due to excessive or improper force, or an improper pulling direction, as shown in FIG. 3.

Moreover, to protect the pins 12 of the CPU 1 from damage due to excessive force or improper direction, the phase change material 5 can be heated to a temperature higher than the melting point thereof. Once the phase change material 5 melts, the CPU 1 (or integrated heat spreader 2) can be easily separated from the heat sink 4. Heating the phase change material 5, however, is time-consuming.

Hence, there is a need to provide an improved heat dissipating apparatus to overcome the aforementioned problems. The present heat dissipating apparatus has a simplified structure and is easily separated from a CPU, considerably reducing disassembly time and potential damage thereto.

SUMMARY OF THE INVENTION

Accordingly, an object of the invention is to provide a heat dissipating apparatus for an electronic device having an integrated heat spreader. The heat dissipating apparatus comprises a base having a lower surface and an upper surface. The lower surface has a contact area to contact the integrated heat spreader when the base is disposed on the electronic device. The lower surface has a concave area extended to the contact area from the edge of the base.

Preferably, the contact area of the base is connected to the integrated heat spreader by means of thermal paste.

Preferably, the thermal paste is composed of a phase change material.

Preferably, the base further comprises a plurality of fins formed on the upper surface thereof.

Preferably, the cross section of the concave area is rectangular, semicircular or triangular.

Preferably, the integrated heat spreader and contact area are substantially rectangular.

Preferably, the electronic device is a central processing unit (CPU).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
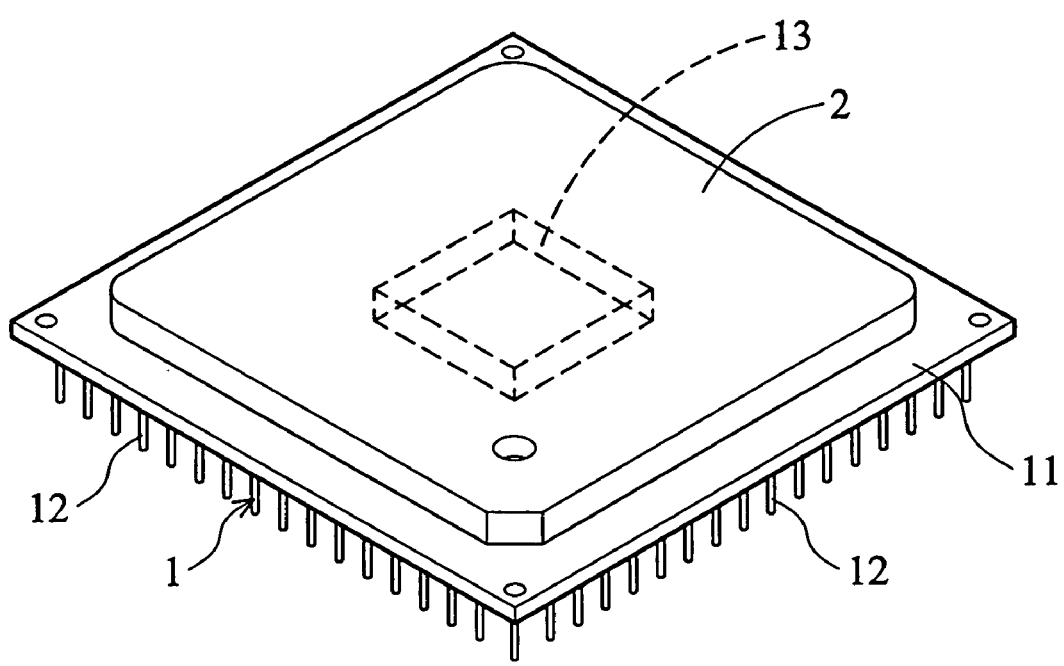
FIG. 1 is a schematic perspective view showing an integrated heat spreader disposed on a central processing unit.
Figure 2:
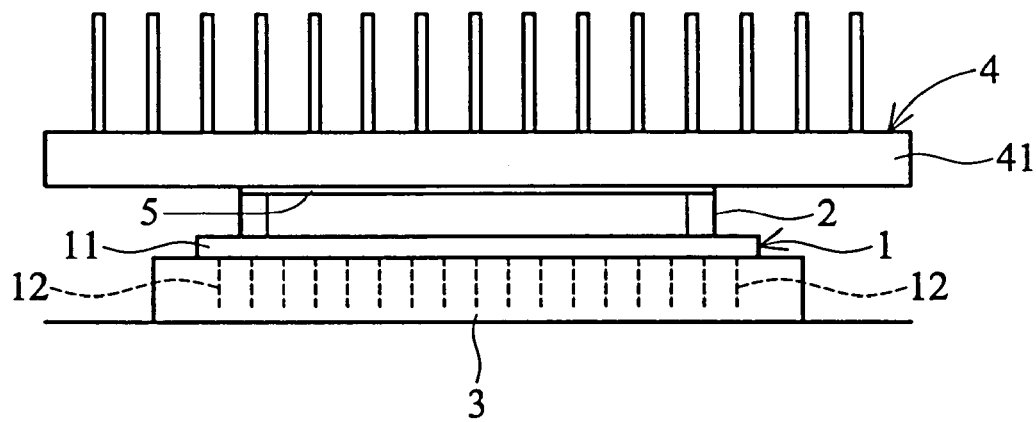
FIG. 2 is a schematic side view showing a conventional heat sink and the central processing unit inserted into a socket.
Figure 3:
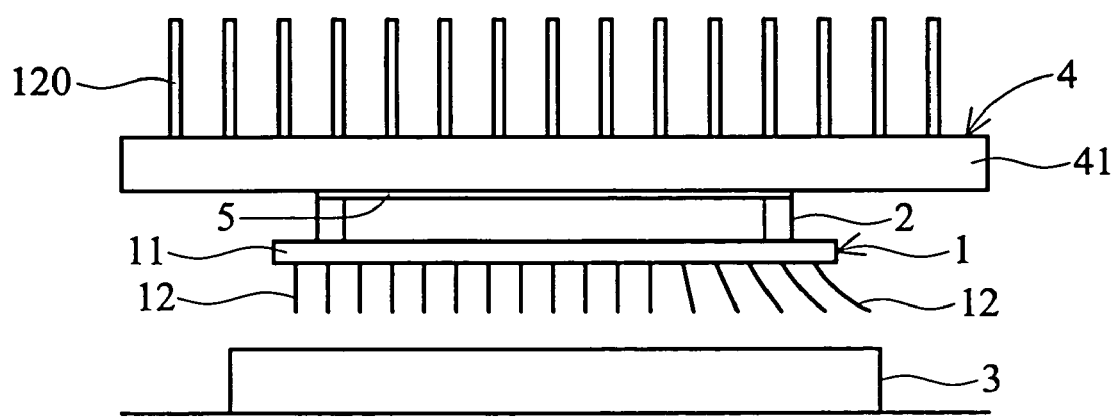
FIG. 3 is a schematic side view showing the conventional heat sink and central processing unit separated from the socket according to FIG. 2.
Figure 4A:
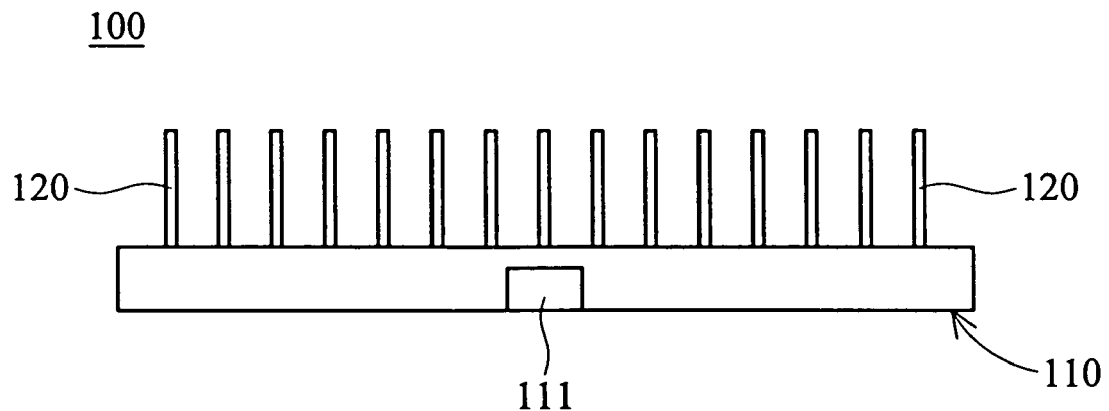
FIG. 4A is a schematic side view showing the heat dissipating apparatus of the invention.
Figure 4B:
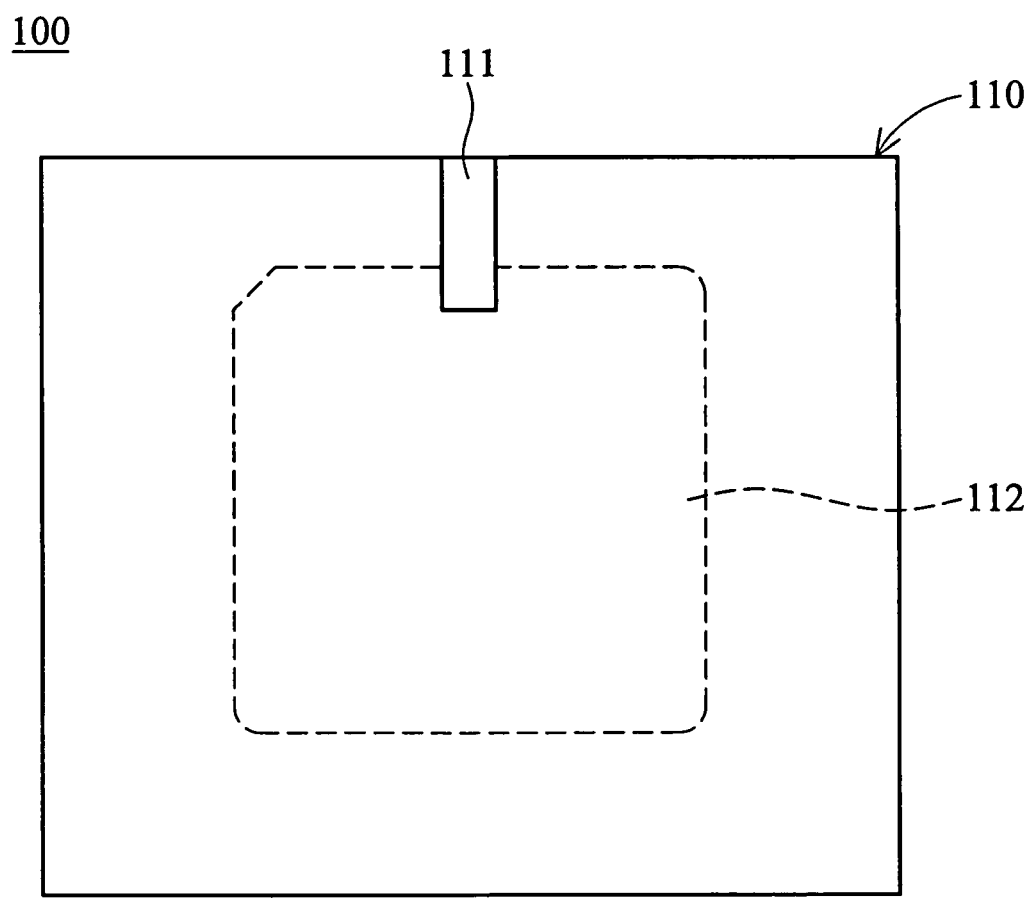
FIG. 4B is a schematic bottom view according to FIG. 4A.

Referring to FIG. 4A and FIG. 4B, the heat dissipating apparatus 100 includes a base 110 and a plurality of fins 120. The fins 120 are uniformly formed on the base 110 to dissipate heat. Additionally, a concave area 111 and a contact area 112 are formed on the lower surface of the base 110. As shown in FIG. 4A, the cross section of the concave area 111 is rectangular. As shown in FIG. 4B, the concave area 111 extends into the contact area 112 from the edge of the lower surface of the base 110. The plurality of fins 120 are formed on the upper surface of the base 110.

Figure 5:
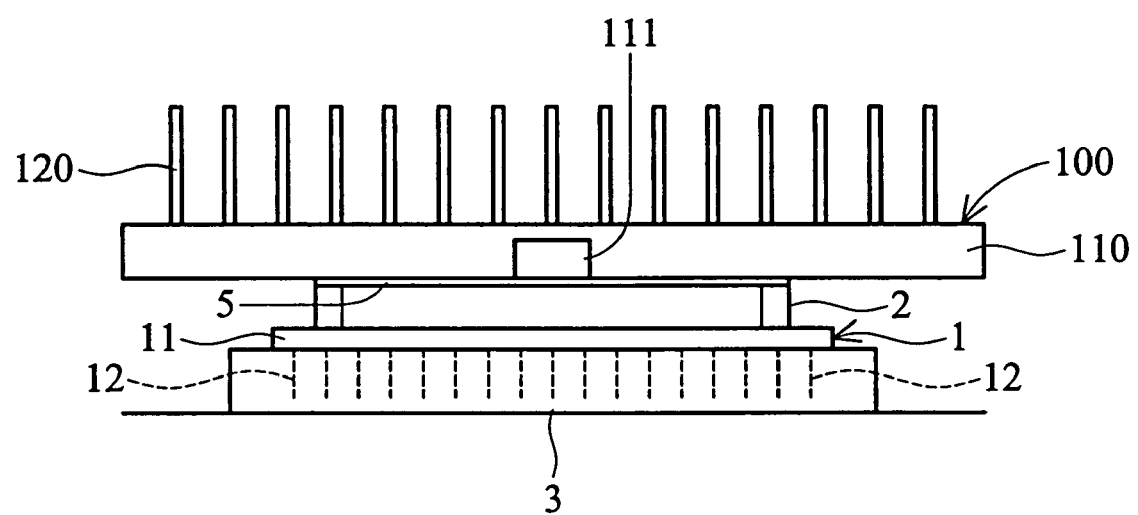
FIG. 5 is a schematic side view showing the present heat dissipating apparatus and a central processing unit inserted into a socket.

Referring to FIG. 5, the heat dissipating apparatus 100 is applicable to an electronic device 1 having an integrated heat spreader 2 to perform thermal conduction and heat dissipation. The electronic device 1 may be a central processing unit packaged by means of an FCPGA method. The central processing unit (CPU) 1 includes a substrate 11, a plurality of pins 12 and a silicon chip (not shown). The integrated heat spreader 2 is disposed on the substrate 11 of the CPU 1.

As shown in FIG. 5, the CPU 1 is inserted into a socket 3. When the heat dissipating apparatus 100 is disposed on the CPU 1, the base 110 of the heat dissipating apparatus 100 contacts the integrated heat spreader 2 disposed on the CPU 1. Specifically, the integrated heat spreader 2 is connected to the contact area 112 shown in FIG. 4B, on the lower surface of the base 110. Additionally, thermal paste, such as a phase change material (PCM) 5, is disposed between the contact area 112 and integrated heat spreader 2 to fill the gap therebetween. Thus, the surface contact area between the contact area 112 and integrated heat spreader 2 is increased, and the thermal conduction therebetween is enhanced. Specifically, the position of the contact area 112 of the base 110 corresponds to that of the integrated heat spreader 2. Furthermore, the shape of the contact area. 112 may be the same as that of the integrated heat spreader 2 and substantially rectangular.

Figure 6:
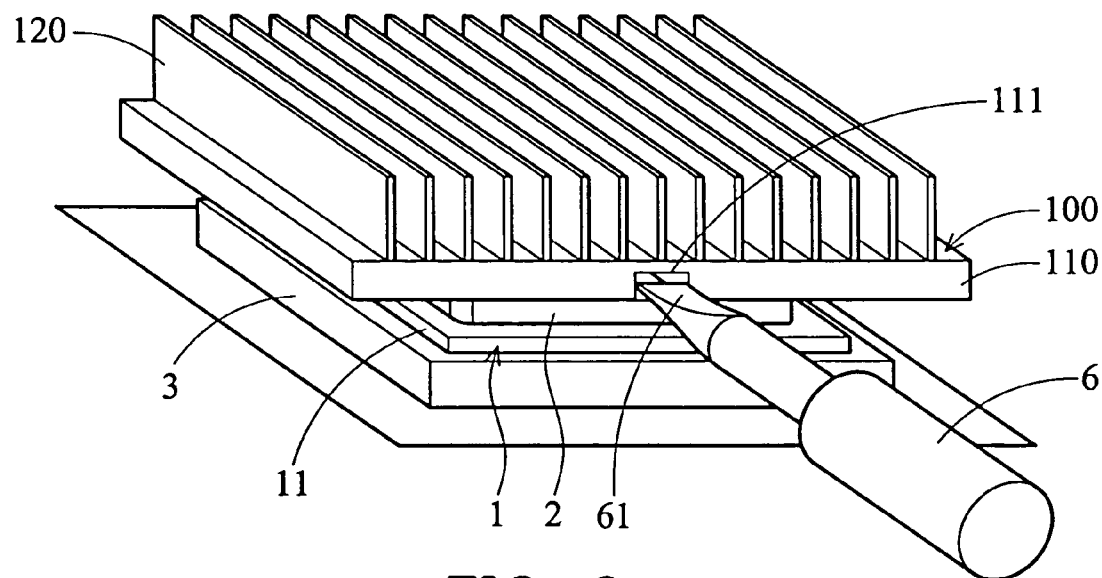
FIG. 6 is a schematic perspective view showing a slotted screwdriver inserted into the heat dissipating apparatus of the invention.
Figure 7:
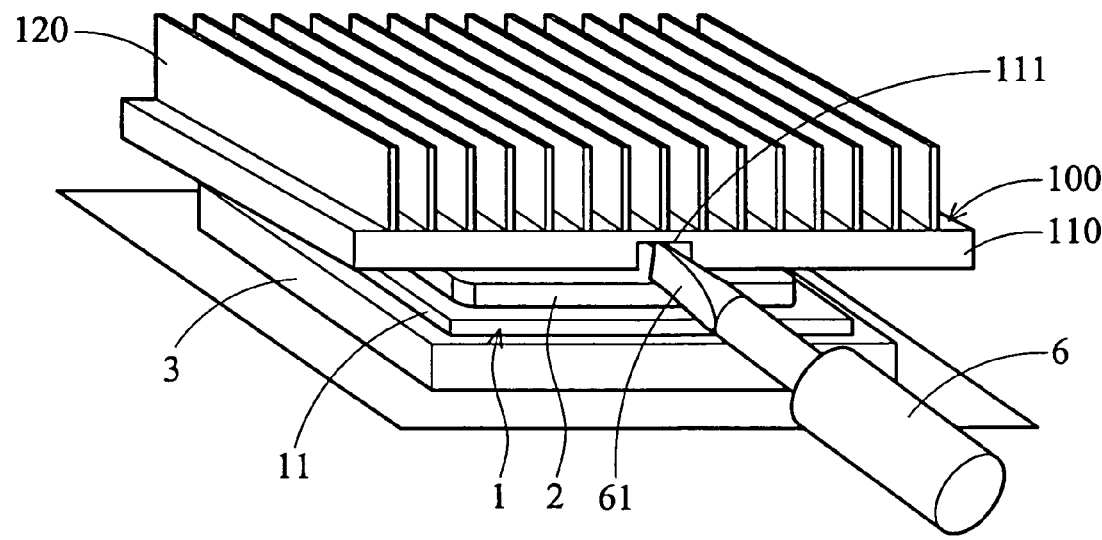
FIG. 7 is a schematic perspective view showing the present heat dissipating apparatus separated from the central processing unit by means of the slotted screwdriver.

Similarly, when the CPU 1 operates, the phase change material 5 melts due to the high temperature thereof and is attached to the integrated heat spreader 2 and base 110. When the CPU 1 cools, the phase change material 5 becomes solid again and creates a strong adhesive bond between the integrated heat spreader 2 and base 110. At this time, the heat dissipating apparatus 100 can be simply separated from the integrated heat spreader 2 by means of a slotted screwdriver. Specifically, as shown in FIG. 4B and FIG. 6, the flat end 61 of a slotted screwdriver 6 is inserted into the contact area 112 via the concave area 111 of the base 110. As shown in FIG. 4B and FIG. 7, the slotted screwdriver 6 is then rotated about 90 degrees inside the contact area 112 and the integrated heat spreader 2 is easily separated from the base 110. Further, the CPU 1 and integrated heat spreader 2 can be directly disassembled from the socket 3 without damaging the pins 12 of the CPU 1.

Accordingly, since the structure of the substrate 11 of the CPU 1 is fragile, the concave area 111 of the base 110 is extended to the contact area 112 to prevent the slotted screwdriver 6 from exerting force on the substrate 11 of the CPU 1. Thus, the substrate 11 does not break and the circuits therein are not damaged. In another aspect, the integrated heat spreader 2 is composed of copper-based alloy, such that the integrated heat spreader 2 is more resistant to force.

Moreover, the cross section of the concave area 111 of the base 110 is not limited to a rectangular shape. The cross section of the concave area 111 may be semicircular or triangular as long as a slotted screwdriver or similar tool can be inserted into the concave area 111 and rotated therein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipating apparatus for an electronic device having an integrated heat spreader, comprising:
a base having a lower surface and an upper surface, the lower surface having a contact area to contact the integrated heat spreader when the base is disposed on the electronic device, and the lower surface having a concave area extended to the contact area from an edge of the lower surface of the base.

2. The heat dissipating apparatus as claimed in claim 1, wherein the contact area of the base is connected to the integrated heat spreader by means of thermal paste.

3. The heat dissipating apparatus as claimed in claim 2, wherein the thermal paste is composed of a phase change material.

4. The heat dissipating apparatus as claimed in claim 1, wherein the base further comprises a plurality of fins formed on the upper surface thereof.

5. The heat dissipating apparatus as claimed in claim 1, wherein the cross section of the concave area is rectangular.

6. The heat dissipating apparatus as claimed in claim 1, wherein the cross section of the concave area is semicircular.

7. The heat dissipating apparatus as claimed in claim 1, wherein the cross section of the concave area is triangular.

8. The heat dissipating apparatus as claimed in claim 1, wherein the integrated heat spreader and contact area are substantially rectangular.

9. The heat dissipating apparatus as claimed in claim 1, wherein the electronic device is a central processing unit (CPU).

10. A heat dissipating apparatus, disposed on an electronic device having an integrated heat spreader, comprising:
a base having a concave area and a contact area, wherein the contact area is connected to the integrated heat spreader, the shape and position of the contact area correspond to the shape and position of the integrated heat spreader, and the concave area is extended to the contact area from an edge of the base; and
a thermal paste disposed between the contact area and integrated heat spreader.

11. The heat dissipating apparatus as claimed in claim 10, wherein the thermal paste is composed of a phase change material.

12. The heat dissipating apparatus as claimed in claim 10, wherein the base further comprises a plurality of fins formed thereon.

13. The heat dissipating apparatus as claimed in claim 10, wherein the cross section of the concave area is rectangular.

14. The heat dissipating apparatus as claimed in claim 10, wherein the cross section of the concave area is semicircular.

15. The heat dissipating apparatus as claimed in claim 10, wherein the cross section of the concave area is triangular.

* * * * *